United States Patent [19]

Ettenberg

[11] 3,960,620

[45] June 1, 1976

[54] METHOD OF MAKING A TRANSMISSION MODE SEMICONDUCTOR PHOTOCATHODE

[75] Inventor: Michael Ettenberg, Freehold, N.J.

[73] Assignee: RCA Corporation, New York, N.Y.

[22] Filed: Apr. 21, 1975

[21] Appl. No.: 569,850

[52] U.S. Cl. .................................. 148/175; 29/572; 136/89; 156/612; 313/94; 357/30

[51] Int. Cl.$^{2}$ .................. H01L 21/20; H01L 21/31; H01L 31/00

[58] Field of Search ....................... 148/175; 357/30; 156/612; 136/89; 29/572; 427/160, 166, 167; 350/164; 313/94

[56] References Cited

UNITED STATES PATENTS

| | | | |
|---|---|---|---|
| 3,391,282 | 7/1968 | Kabell | 357/30 X |
| 3,494,809 | 2/1970 | Ross | 148/175 |
| 3,508,126 | 4/1970 | Newman et al. | 357/30 X |
| 3,549,411 | 12/1970 | Bean et al. | 427/160 X |
| 3,672,992 | 6/1972 | Schaefer | 313/65 X |
| 3,769,104 | 10/1973 | Ono et al. | 148/175 |
| 3,913,218 | 10/1975 | Miller | 357/30 X |
| 3,914,136 | 10/1975 | Kressel | 313/94 X |

*Primary Examiner*—L. Dewayne Rutledge
*Assistant Examiner*—W. G. Saba
*Attorney, Agent, or Firm*—Glenn H. Bruestle; Donald S. Cohen

[57] ABSTRACT

A flat substrate body of a single crystalline semiconductor material which is transparent to radiation but which can disassociate when subjected to heat is first coated on one surface with a coating of a transparent, anti-reflective material which will protect the body from disassociation. One or more layers of a single crystalline semiconductor material are then epitaxially deposited on another surface of the body under temperature conditions which could cause the disassociation of the material of the body. The last epitaxial layer deposited is of a material which is capable of generating electrons in response to incident radiation. A layer of a work function reducing material is then coated on the last epitaxial layer.

6 Claims, 3 Drawing Figures

METHOD OF MAKING A TRANSMISSION MODE SEMICONDUCTOR PHOTOCATHODE

BACKGROUND OF THE INVENTION

The present invention relates to a method of making a transmission mode semiconductor photocathode and particularly to a method of making such a photocathode without impairing the radiation transmission properties of the photocathode.

Transmission mode photocathodes are devices which emit electrons from one surface in response to incident radiation which passes through the device from a surface opposite the emissive surface. Certain single crystalline semiconductor material, such as gallium arsenide, indium gallium arsenide, gallium phosphide and indium arsenide phosphide, are known to be suitable for the active region of such photocathodes, particularly if its emissive surface has a negative electron affinity. To achieve efficient emission of electrons generated in the active region it is generally necessary to make the active region relatively thin, generally about one micron in thickness. Since such a thin region of the semiconductor material is not self supporting it is the practice to form the active region on a supporting substrate body, such as by epitaxially depositing the active region on the substrate body. The substrate body must be of a material which is transparent to the radiation and which will nucleate the epitaxial growth of the single crystalline material of the active region. Certain single crystalline semiconductor materials, particularly certain of the group III-V compounds and alloys of such compounds, have been found to be suitable for use as the substrate body. If the material of the substrate body has a crystal lattice which is substantially different from the crystal lattice of the material of the active region a transition region of a single crystalline semiconductor material may be provided between the substrate body and the active region to provide an active region of good crystalline quality. The transition region may be of a graded composition, such as described in an article by D. G. Fisher et al., "Negative Electron Affinity Materials For Imaging Devices" in *Advances in Images Pickup and Display*, Vol. I, Published by Academic Press, Inc. 1974, on page 111, or may include growth interfaces as described in U.S. Pat. No. 3,862,859, to M. Ettenberg et al., issued Jan. 28, 1975, entitled "Method of Making A Semiconductor Device ", to achieve its desired function.

In making such a transmission mode semiconductor photocathode, the transition region, if used, and the active region are epitaxially deposited on the substrate body by either of the well known processes of vapor phase epitaxy or liquid phase epitaxy. In both of these processes the substrate body is subjected to a relatively high temperature, e.g. 900°C or above. Many of the semiconductor materials used for the substrate body, particularly the group III-V compounds, include a volatile element which may vaporize at the temperatures used in the deposition process causing disassociation of the material at the surface of the body. Such disassociation of the material of the body at the radiation incident surface of the body would impair the optical properties of the body. For example, if a substrate body of gallium phosphide is used, the phosphorus, which has a relatively high vapor pressure, would vaporize leaving surface faults and opaque gallium on the surface, both of which would impair the radiation transmissive properties of the substrate body. If the amount of radiation which can enter the active region through the substrate body is reduced by the impaired optical properties of the body, then the efficiency of the photocathode is reduced and the imaging quality of the device will be impaired. Therefore, it would be desirable to have a method of making the semiconductor photocathode which would not impair the optical properties of the device.

SUMMARY OF THE INVENTION

A transmission mode semiconductor photocathode is made by first coating a surface of a flat body of a single crystalline semiconductor material with a layer of an optically transparent material. At least one layer of a single crystalline semiconductor material is then epitaxially deposited on another surface of the body. A layer of a work-function-reducing material is then coated on the semiconductor material layer. The optically transparent material is also an antireflective material and is capable of preventing disassociation of the semiconductor material of the body.

DETAILED DESCRIPTION

Figure 1:
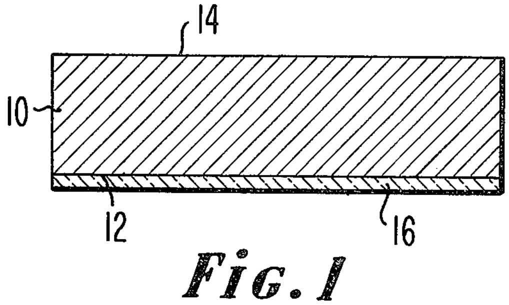
FIGS. 1, 2 and 3 are sectional views illustrating various steps of the method of the present invention.

A transmission photocathode is made by starting with a flat substrate body 10 which has opposed surfaces 12 and 14. The substrate body 10 is of a material which is transparent to radiation of the type by which the photocathode is designed to be excited and which will nucleate the epitaxial growth of the material of the active region of the photocathode. The substrate body 10 is preferably of a single crystalline material, particularly a group III–V semiconductor compound or an alloy of such compounds, such as gallium phosphide, aluminum gallium arsenide and indium gallium phosphide. As shown in FIG. 1, one surface 12 of the substrate body 10 is coated with a layer 16 of a material which is transparent to the excitation radiation, is an antireflective material in that it reduces the reflective loss of radiation at the surface 12 of the substrate body 10, and which can withstand the temperatures to which the device will be subjected during further steps of the method of the present invention so as to prevent disassociation of the semiconductor material of the body. Silicon monoxide and aluminum oxide have been found suitable for use for the layer 16.

The antireflective layer 16 may be deposited on the surface 12 of the substrate body 10 by the well known technique of evaporation in a vacuum. For this process the material of the antireflective layer 16 and the substrate body 10 are placed in a chamber which is sealed and evacuated. The material of the antireflective layer 16 is then heated until the material vaporizes. The vapors then condense on the cooler surface 12 of the substrate body 10 to form the layer 16. In this process the substrate body 10 is at a temperature low enough that no disassociation of the material of the substrate body takes place.

Figure 2:
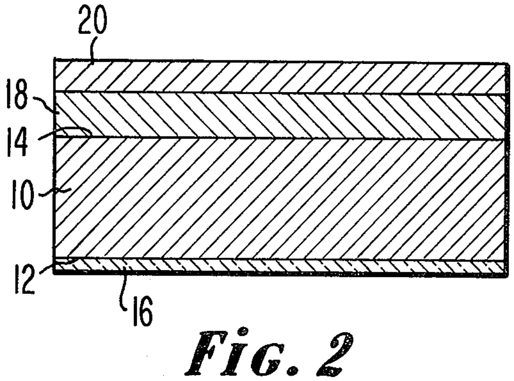

As shown in FIG. 2, a transition region 18 of a single crystalline semiconductor material is then epitaxially deposited on the surface 14 of the body 10, and an active region 20 of a single crystalline semiconductor material is epitaxially deposited on the transition region 18. The transition region is optional as hereinafter discussed.

The active region 20 is of a semiconductor material such as gallium arsenide, indium gallium arsenide, gallium phosphide and indium arsenide phosphide, which is capable of emitting electrons in response to incident radiation. As is well known in the art, the semiconductor material of the active region 20 is preferably of P type conductivity to achieve generation of electrons.

The transition region 18 is of a composition or structure which compensates for differences in the crystal lattice of the material of the active region 20 and the material of the body 10 so as to permit the growth of good quality single crystalline material for the active region 20.

The transition region 18 may be of a ternary group III-V material having a graded composition so that the lattice constant of the transition region 18 adjacent the body 10 is equal to or close to that of the material of the body 10 and at the active region 20 is equal to or close to that of the material of the active region. Such a transition region is described in the previously referred to article by D. G. Fisher et al. Alternatively, the transition region 18 may be of uniform composition and include one or more growth interfaces as described in U.S. Pat. No. 3,862,859.

Each of the transition region 18 and the active region 20 may be epitaxially deposited by either of the well known techniques of liquid phase epitaxy or vapor phase epitaxy. If the two regions are deposited by the technique of liquid phase epitaxy, this can be carried out using the method and apparatus described in U.S. Pat. No. 3,753,801 to H. F. Lockwood et al. issued Aug. 31, 1973, entitled "Method of Depositing Epitaxial Semiconductor Layers From the Liquid Phase", which is herewith incorporated by reference. Using this technique, each of the regions is deposited from a separate heated solution of the particular semiconductor material to be deposited and an appropriate conductivity modifier, if required, in a solvent. The surface 14 of the body 10 is first brought into contact with the solution in order to deposit the transition region 18 thereon. The temperature of the solution is then reduced causing some of the semiconductor material in the solution to percipitate out and deposit as an epitaxial layer on the body 10. The surface of the transition region 18 is then brought into contact with the solution in order to deposit the active region 20 on the region 18. The temperature of the solution is reduced causing some of the semiconductor material in the solution to percipitate out and deposit as an epitaxial layer on the transition region 18 thereby forming the active region 20.

If the regions are deposited by the technique of vapor phase epitaxy, this can be carried out using the method and apparatus described in the article by J. J. Tietjan et al., "The Preparation and Properties of Vapor-Deposited Epitaxial $GaAs_{1-x}P_x$ Using Arsine and Phosphine", *Journal Electrochemical Society*, Vol. 113, 1966, page 724, which is herewith incorporated by reference. As described in this article, the deposition is from a gas containing the elements of the material being deposited. The gas is heated to a temperature at which a reaction occurs to form the semiconductor material which deposits on the body 10.

During the epitaxial deposition of the transition region 18 and the active region 20, whether by liquid phase epitaxy or vapor phase epitaxy, the body 10 is subjected to temperatures which may cause disassociation of the material of the body 10 at the uncoated surfaces thereof. However, since the surface 12 of the body 10 is coated with the antireflective coating 16, disassociation of the material of the body 10 along the surface 12 is prevented. Thus, by applying the antireflective coating 16 to the surface 12 of the body 10 prior to epitaxially depositing the transition region 18 and active region 20 on the body 10, the optical properties of the surface 12 are not adversely affected during the deposition of the epitaxial regions.

Figure 3:
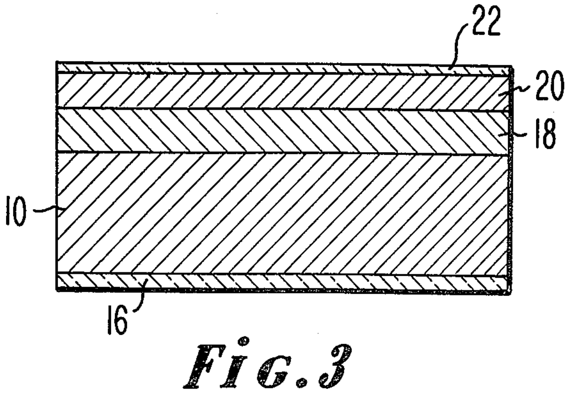

As shown in FIG. 3, a thin layer 22 of a work function reducing material is then applied to the surface of the active region 20. The work function reducing layer 22 is of an alkali earth metal and oxygen, and is monomolecular or has a thickness not exceeding a few atomic diameter of the work function reducing material. The alkali or alkaline earth metal of the work function reducing material may be, for example, cesium, potassium, barium or rubidium, with cesium being the preferred metal. The work function reducing layer 22 is preferably applied by the well known technique of evaporation in a vacuum.

The method of the present invention for making a transmission photocathode wherein an antireflection layer is first coated on a surface of the substrate body has a number of advantages. As previously described, during the deposition of the active region of the cathode on the substrate body the antireflective layer prevents disassociation of the material of the substrate body along the surface of the body through which radiation enters the body. Thus, the optical properties of that surface of the body are not adversely affected during the deposition of the active region. In fact, the antireflective layer actually improves the optical properties of the surface so as to allow more radiation to enter the body and thereby permit an improvement in the output of the photocathode. Applying the antireflective layer to the substrate body prior to depositing the active region also provides for greater ease of applying the work function reducing material layer on the active region. If the antireflective layer were to be coated on the substrate body after the active region was deposited on the substrate body, the surface of the active region could become contaminated during the application of the antireflective layer. It would then be difficult to provide a satisfactory work function reducing layer on the contaminated surface of the active region. Also, if the antireflective layer were to be coated on the substrate body after the work function reducing layer was coated on the active region, the work function reducing layer could be contaminated or damaged so as to be unsatisfactory. However, by applying the antireflective layer first, a satisfactory work function reducing layer can be easily applied to the clean surface of the freshly deposited active region.

Although the transmission photocathode 10 has been shown and described as having a transition region between the substrate body and the active region, if the material of the active region has a crystal lattice which substantially matches that of the material of the substrate body, the transition region can be eliminated. If a transition region is not required, the active region can be epitaxially deposited directly on the surface of the substrate body after the antireflective layer has been applied to the substrate body.

I claim:

1. A method of making a transmission semiconductor photocathode comprising the steps of a. coating a surface of a flat body of a single crystalline semiconductor compound which is capable of becoming disassociated when subjected to a specific temperature with a layer of an optically transparent material at a temperature below said specific temperature, said optically transparent material being capable of preventing disassociation of the material of the body when the body is heated to the specific temperature, then b. epitaxially depositing at least one layer of a single crystalline semiconductor material on another surface of said body, and c. coating said semiconductor material layer with a layer of a work-function-reducing material.

2. The method of making a photocathode in accordance with claim 1 wherein said body has a pair of spaced opposed surfaces, the optically transparent layer is coated on one of said opposed surfaces and the semiconductor material layer is deposited on the other of said opposed surfaces.

3. The method of making a photocathode in accordance with claim 2 wherein the optically transparent layer is coated on the body by forming vapors of the material of the layer and condensing the material on the surface of the body.

4. The method of making a photocathode in accordance with claim 3 in which the optically transparent layer is of an antireflective material.

5. The method of making a photocathode in accordance with claim 2 wherein the semiconductor material layer is deposited on the body by bringing the body into a heated solution of the semiconductor material in a metal solvent and cooling said solution to precipitate out the semiconductor material and depositing the semiconductor material on the body.

6. The method of making a photocathode in accordance with claim 2 wherein the semiconductor material layer is deposited on the body by exposing the body to a gas containing the elements of the semiconductor material and heating said gas to cause a reaction which forms the semiconductor material which deposits on the body.

* * * * *